US012803554B2

(12) United States Patent
Chao et al.

(10) Patent No.: US 12,803,554 B2
(45) Date of Patent: Nov. 17, 2026

(54) LEVEL SHIFTER

(71) Applicant: Novatek Microelectronics Corp., Hsinchu (TW)

(72) Inventors: Yu-Tzu Chao, Kaohsiung City (TW); Yung-Chou Lin, Hsinchu County (TW); Jhih-Siou Cheng, New Taipei City (TW)

(73) Assignee: Novatek Microelectronics Corp., Hsinchu (TW)

( * ) Notice: Subject to any disclaimer, the term of this patent is extended or adjusted under 35 U.S.C. 154(b) by 20 days.

(21) Appl. No.: 18/970,725

(22) Filed: Dec. 5, 2024

(65) Prior Publication Data

US 2026/0135561 A1 May 14, 2026

(30) Foreign Application Priority Data

Nov. 8, 2024 (TW) ................................ 113142837

(51) Int. Cl.
*H03K 19/0185* (2006.01)

(52) U.S. Cl.
CPC ............................ *H03K 19/018521* (2013.01)

(58) Field of Classification Search
CPC .............................................. H03K 19/018521
USPC .......................................................... 327/333
See application file for complete search history.

(56) References Cited

U.S. PATENT DOCUMENTS 7,151,400 B2 * 12/2006 Chen ................ H03K 3/356113 327/333
7,468,615 B1 * 12/2008 Tan ................ H03K 19/018528 327/333
8,587,360 B2 * 11/2013 Ucciardello ......... H03K 17/102 327/333
9,385,722 B2 * 7/2016 Trivedi ............ H03K 3/356113
10,305,482 B2 * 5/2019 Chen ...................... H02M 3/155
10,862,463 B1 * 12/2020 Zhou ................ H03K 3/356182
10,868,536 B1 * 12/2020 Ke ................. H03K 19/018514
11,005,460 B1 * 5/2021 Abesingha ............. H03K 3/013

(Continued)

FOREIGN PATENT DOCUMENTS

CN 114499497 5/2022

OTHER PUBLICATIONS

"Office Action of Taiwan Counterpart Application", issued on Jun. 23, 2025, p. 1-p. 5.

*Primary Examiner* — Ryan Jager
(74) *Attorney, Agent, or Firm* — JCIPRNET

(57) ABSTRACT

The invention provides a level shifter disposed in a die. The level shifter includes a pull-up transistor, a first pull-down transistor, a second pull-down transistor, and a control circuit. A first terminal of the pull-up transistor receives a first power voltage higher than a substrate voltage of the die. A first terminal of the first pull-down transistor receives a second power voltage lower than the substrate voltage. The second pull-down transistor is coupled between the first pull-down transistor and the pull-up transistor. A second terminal of the pull-up transistor is coupled to an output terminal of the level shifter. An input terminal of the control circuit is coupled to an input terminal of the level shifter. Different output terminals of the control circuit are respectively coupled to control terminals of the pull-up transistor, the second pull-down transistor, and the first pull-down transistor.

15 Claims, 7 Drawing Sheets

(56) References Cited

U.S. PATENT DOCUMENTS

| | | | | |
|---|---|---|---|---|
| 2005/0285658 | A1* | 12/2005 | Schulmeyer ........... | H03K 25/02 327/333 |
| 2008/0204110 | A1* | 8/2008 | Ishida .............. | H03K 3/356104 327/333 |
| 2008/0218141 | A1* | 9/2008 | Lu ......................... | H03K 17/162 323/282 |
| 2009/0189638 | A1* | 7/2009 | Chen ...................... | G11C 5/145 326/68 |
| 2010/0109744 | A1* | 5/2010 | Czech ............ | H03K 19/018521 327/333 |
| 2013/0222037 | A1* | 8/2013 | Zhang .............. | H03K 3/356182 327/333 |
| 2016/0149579 | A1* | 5/2016 | Trivedi .......... | H03K 19/018521 326/81 |
| 2023/0421155 | A1* | 12/2023 | Sønnichsen ...... | H03K 3/356017 |
| 2026/0012011 | A1* | 1/2026 | Vemuri .................. | H02H 9/046 |

* cited by examiner

LEVEL SHIFTER

CROSS-REFERENCE TO RELATED APPLICATION

This application claims the priority benefit of Taiwan application serial no. 113142837, filed on Nov. 8, 2024. The entirety of the above-mentioned patent application is hereby incorporated by reference herein and made a part of this specification.

BACKGROUND OF THE INVENTION

Field of the Invention

The invention relates to an integrated circuit (IC), and in particular to a large voltage swing level shifter disposed in a die.

Description of Related Art

A level shifter is generally disposed in a die. When the lower limit of the voltage swing of the output terminal of a level shifter is lower than the substrate voltage (VSUB) of the die, the junction (parasitic diode) between the P-type substrate of the die and the pull-down transistor of the level shifter is conductive, that is, leakage occurs in the level shifter. Therefore, the existing substrate voltage (VSUB) of a die cannot be set to 0 volt.

SUMMARY OF THE INVENTION

The invention provides a level shifter to provide an output with a voltage swing from a first power voltage (higher than a substrate voltage of a die) to a second power voltage (lower than the substrate voltage).

In an embodiment of the invention, a level shifter is disposed in a die. The level shifter includes a pull-up transistor, a first pull-down transistor, a second pull-down transistor, and a control circuit. A first terminal of the pull-up transistor is coupled to a first power voltage, wherein the first power voltage is higher than a substrate voltage of the die. A second terminal of the pull-up transistor is coupled to an output terminal of the level shifter. A first terminal of the first pull-down transistor is coupled to a second power voltage, wherein the second power voltage is lower than the substrate voltage of the die. A first terminal of the second pull-down transistor is coupled to a second terminal of the first pull-down transistor. A second terminal of the second pull-down transistor is coupled to an output terminal of the level shifter. An input terminal of the control circuit is coupled to an input terminal of the level shifter. A first output terminal of the control circuit is coupled to a control terminal of the pull-up transistor. A second output terminal of the control circuit is coupled to a control terminal of the second pull-down transistor. A third output terminal of the control circuit is coupled to a control terminal of the first pull-down transistor.

Based on the above, in some embodiments, the first pull-down transistor and the second pull-down transistor may be fully isolated metal-oxide-semiconductor (MOS) transistors. Therefore, the first pull-down transistor and the second pull-down transistor do not cause leakage to the substrate of the die. In addition, the first pull-down transistor and the second pull-down transistor are connected in series between the output terminal of the level shifter and the second power voltage (lower than the substrate voltage of the die). Therefore, the cross-voltage withstand capability (rated maximum source-drain voltage) of any in the first pull-down transistor and the second pull-down transistor may be lower than the voltage difference between the first power voltage and the second power voltage.

In order to make the aforementioned features and advantages of the disclosure more comprehensible, embodiments accompanied with figures are described in detail below.

DESCRIPTION OF THE EMBODIMENTS

Figure 1:
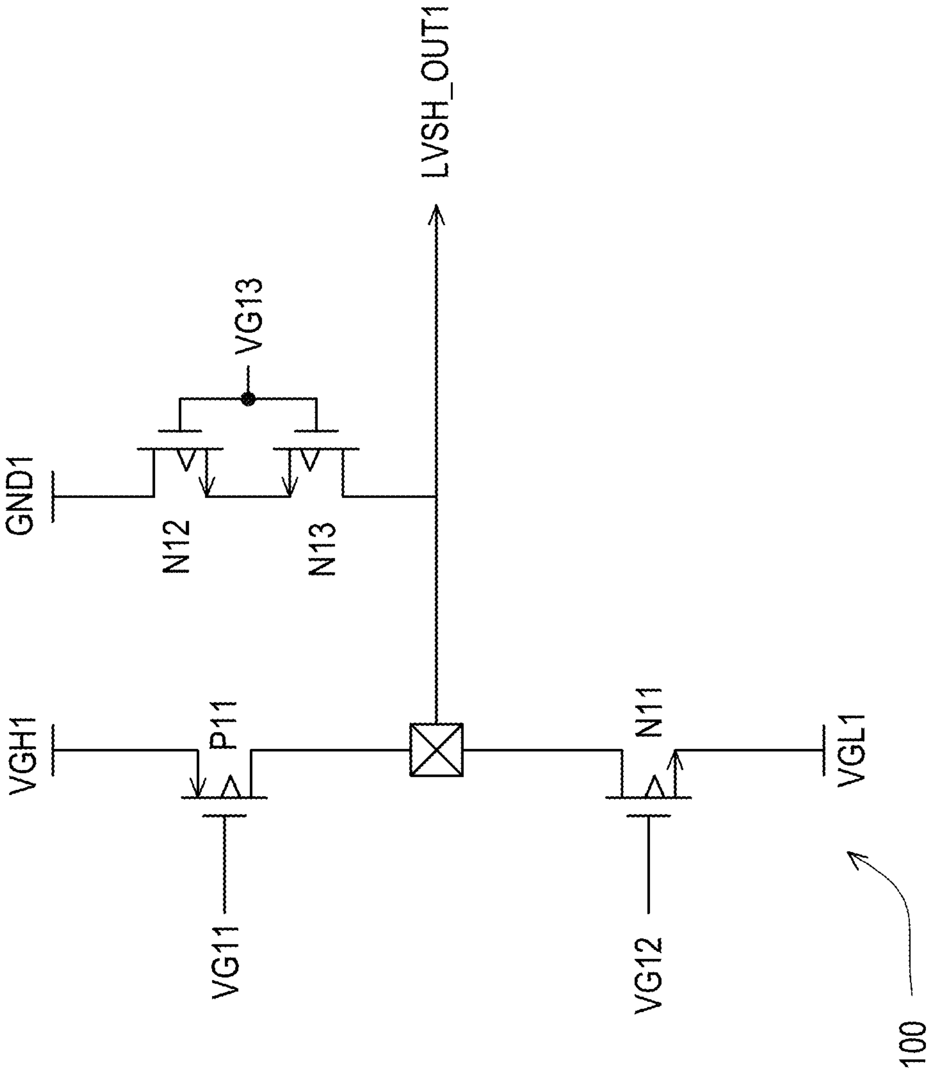
FIG. 1 is a schematic circuit diagram of a level shifter disposed in a die shown according to an embodiment.

The term "coupled to (or connected to)" used in the entire text of the specification of the present application (including claims) may refer to any direct or indirect connecting means. For example, if it is herein described that a first device is coupled (or connected) to a second device, it should be interpreted that the first device may be directly connected to the second device, or the first device may be indirectly connected to the second device via other devices or some connection means. Terms such as "first" and "second" mentioned throughout the specification (including the claims) of the present application are used to name elements or to distinguish between different embodiments or scopes, and are not used to limit the upper bound or the lower bound of the number of elements, nor used to limit the sequence of elements. In addition, wherever possible, elements/members/steps using the same reference numerals in the drawings and embodiments denote the same or similar parts. Cross-reference may be made to relevant descriptions of elements/members/steps using the same reference numerals or using the same terms in different embodiments.

FIG. 1 is a schematic circuit diagram of a level shifter 100 disposed in a die shown according to an embodiment. The level shifter 100 includes a pull-up transistor P11, a pull-down transistor N11, a charge sharing transistor N12, and a charge sharing transistor N13. The transistors P11, N11, N12, and N13 are metal-oxide-semiconductor (MOS) transistors. For example, in an embodiment, the transistor P11 is a P-channel MOS (PMOS) transistor, and the transistors N11, N12, and N13 are N-channel MOS (NMOS) transistors. The charge sharing transistors N12 and N13 are connected in series between a ground voltage GND1 and an output terminal LVSH_OUT1. The charge sharing transistors N12 and N13 are controlled by a control signal VG13. When the charge sharing transistors N12 and N13 are turned on, the voltage of the output terminal LVSH_OUT1 may be charge-shared to the ground voltage GND1 (generally 0 V).

The first terminal of the pull-up transistor P11 is coupled to a power voltage VGH1 (for example, 40 V). The power voltage VGH1 is higher than a substrate voltage (VSUB, generally 0 V) of the die. The second terminal of the pull-up transistor P11 is coupled to the output terminal LVSH_OUT1 of the level shifter 100. The pull-up transistor P11 is controlled by a control signal VG11. When the pull-up transistor P11 is turned on, the voltage of the output terminal LVSH_OUT1 is pulled up to the power voltage VGH1. The first terminal of the pull-down transistor N11 is coupled to a power voltage VGL1 (for example, −20 V). The power voltage VGL1 is lower than the substrate voltage (0 V) of the die. The second terminal of the pull-down transistor N11 is coupled to the output terminal LVSH_OUT1 of the level shifter 100. The pull-down transistor N11 is controlled by a control signal VG12. When the pull-down transistor N11 is turned on, the voltage of the output terminal LVSH_OUT1 is pulled down to the power voltage VGL1.

Assumed that the transistors P11, N11, N12, and N13 are laterally diffused MOS (LDMOS) transistors and are non-fully isolated high-voltage MOS transistors. The voltage swing of the drain of the pull-down transistor N11 is between −20 V and 40 V. When the drain voltage of the pull-down transistor N11 is lower than the substrate voltage (0 V) of the die, the junction (parasitic diode) between the P-type substrate of the die and the pull-down transistor N11 is conductive, that is, leakage occurs at the pull-down transistor N11. In any case, the parasitic diode between the P-type substrate and the pull-down transistor N11 should not be turned on.

In order to solve the issue of leakage of the pull-down transistor N11 to the substrate of the die, the substrate voltage of the die may be changed to the negative power voltage VGL1 (for example, −20 V). Since the substrate voltage of the die is not 0 V, the adhesive layer between the substrate of the die and the base plate of the package needs to be changed to a non-conductive material (since the voltage of the package base plate is generally 0 V). Generally, the thermal conductivity of a conductive material is better than the thermal conductivity of a non-conductive material. If the adhesive layer between the substrate of the die and the base plate of the package is made of a conductive material, the heat energy of the die may be readily guided to the outside of the package via the adhesive layer and the package base plate.

In order to solve the issue of leakage of the pull-down transistor N11 to the substrate of the die, the pull-down transistor N11 may be replaced with a fully isolated LDMOS transistor. However, the fully isolated LDMOS transistor is not suitable for a large-swing level shifter because the output voltage swing of the level shifter may exceed the cross-voltage withstand capability (rated maximum source-drain voltage) of the fully isolated LDMOS transistor. Generally, the cross-voltage withstand capability of a fully isolated LDMOS transistor is about 40 V. If a fully isolated LDMOS transistor is simply used to implement the pull-down transistor N11, when the output of the level shifter 100 is 40 V, the fully isolated LDMOS transistor (the pull-down transistor N11) withstands a cross voltage of 60 V and is burnt out.

Figure 2:
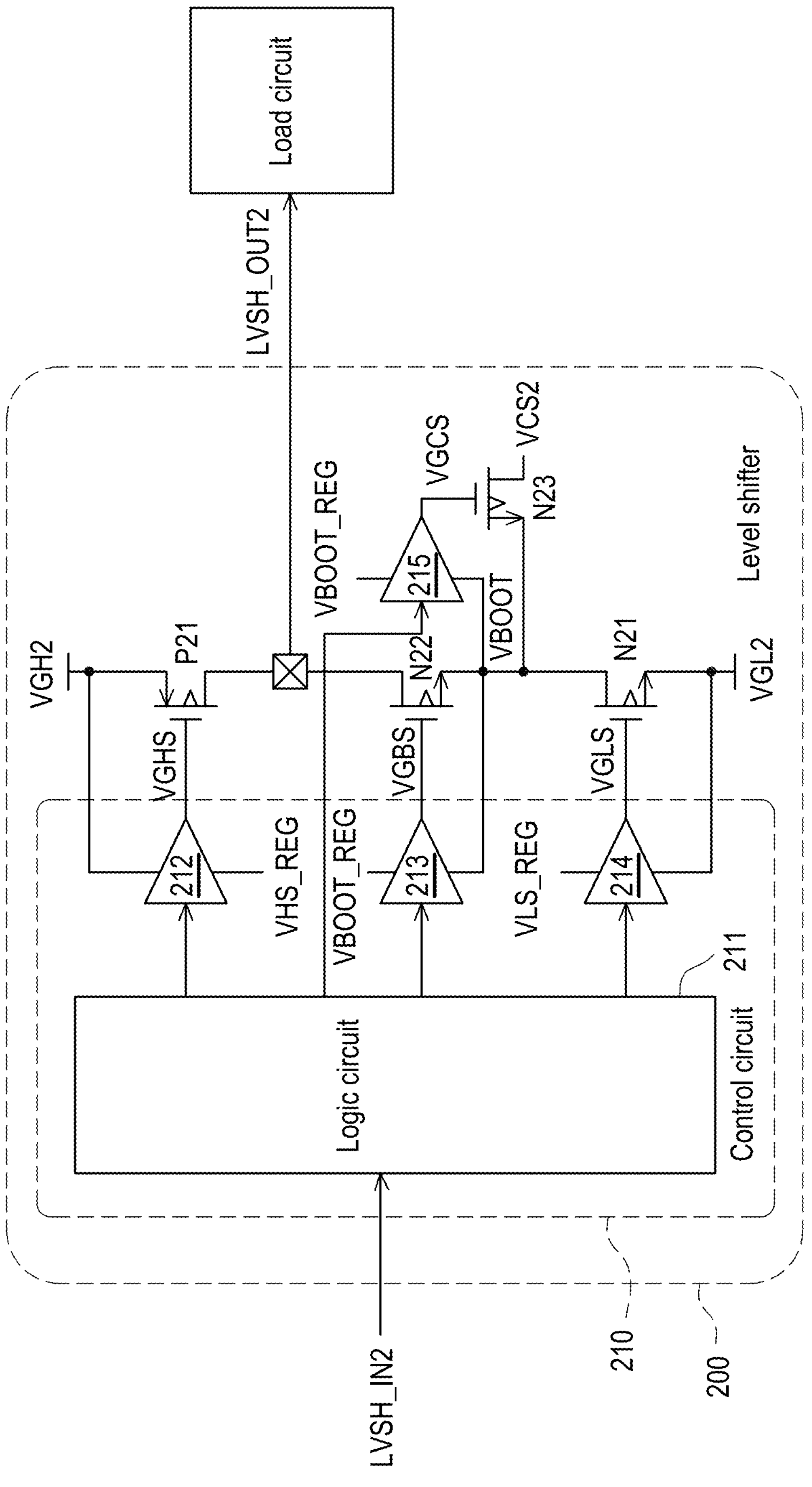
FIG. 2 is a schematic circuit block diagram of a level shifter according to an embodiment of the invention.

FIG. 2 is a schematic circuit block diagram of a level shifter 200 according to an embodiment of the invention. The level shifter 200 is disposed in a die. In some embodiments, the die may be a display driver integrated circuit, a touch driver integrated circuit, or other integrated circuits. The level shifter 200 may shift the voltage of an input terminal LVSH_IN2 to the voltage of an output terminal LVSH_OUT2. For example, the voltage swing of the input terminal LVSH_IN2 may be 0 V to 5 V, and the voltage swing of the output terminal LVSH_OUT2 may be −20 V to 40 V. The output terminal LVSH_OUT2 of the level shifter 200 may provide a shifted voltage to a load circuit. For example, in some embodiments, the load circuit may include a gate-driver-on-array (GOA) circuit disposed on a display panel. In some other embodiments, the load circuit may include other circuits.

The level shifter 200 shown in FIG. 2 includes a pull-up transistor P21, a pull-down transistor N21, a pull-down transistor N22, a charge sharing transistor N23, and a control circuit 210. The input terminal of the control circuit 210 is coupled to the input terminal LVSH_IN2 of the level shifter. The control terminals (e.g., the gates) of the transistors P21, N21, N22, and N23 are coupled to different output terminals of the control circuit 210. The first output terminal of the control circuit 210 outputs a control signal VGHS to control the control terminal of the pull-up transistor P21. The second output terminal of the control circuit 210 outputs a control signal VGBS to control the control terminal of the pull-down transistor N22. The third output terminal of the control circuit 210 outputs a control signal VGLS to control the control terminal of the pull-down transistor N21. The fourth output terminal of the control circuit 210 outputs a control signal VGCS to control the control terminal of the charge sharing transistor N23.

The present embodiment does not limit the specific implementation of the control circuit 210. For example, the control circuit 210 may include a logic circuit 211, a driver 212, a driver 213, a driver 214, and a driver 215. The drivers 212, 213, 214, and 215 may be output buffers or other driver circuits. Based on the voltage of the input terminal LVSH_IN2, the logic circuit 211 may control the transistors P21, N21, N22, and N23. For example, the logic circuit 211 may generate the control signal VGHS via the driver 212 to control the control terminal of the pull-up transistor P21. A power terminal and a reference terminal of the driver 212 receive power voltages VGH2 and VHS_REG respectively, wherein the level of the power voltage VHS_REG is the level of the power voltage VGH2 minus the difference voltage (such as 5 V or other real numbers). Therefore, the swing of the control signal VGHS is between the power voltage VGH2 and the power voltage VHS_REG.

The logic circuit 211 may generate the control signal VGLS via the driver 214 to the control terminal of the pull-down transistor N21. The power terminal and the reference terminal of the driver 214 receive power voltages VLS_REG and VGL2 respectively, wherein the level of the power voltage VLS_REG is the level of the power voltage VGL2 plus the difference voltage (such as 5 V or other real numbers). Therefore, the swing of the control signal VGLS is between the power voltage VLS_REG and the power voltage VGL2. The logic circuit 211 may generate the control signal VGBS via the driver 213 to the control terminal of the pull-down transistor N22. The power terminal and the reference terminal of the driver 213 receive node voltages VBOOT_REG and VBOOT respectively, wherein the node voltage VBOOT_REG is greater than the node voltage VBOOT. For example, the node voltage VBOOT_REG is the node voltage VBOOT plus the difference voltage. Therefore, the swing of the control signal VGBS is between the node voltage VBOOT_REG and the node voltage VBOOT. The logic circuit 211 may generate the control signal VGCS via the driver 215 to the control terminal of the charge sharing transistor N23. The power terminal and the reference terminal of the driver 215 receive the node voltages VBOOT_REG and VBOOT respectively.

Therefore, the swing of the control signal VGCS is between the node voltage VBOOT_REG and the node voltage VBOOT.

The transistors P21, N21, N22, and N23 are MOS transistors. For example, in an embodiment, the transistor P21 is a P-channel MOS (PMOS) transistor, and the transistors N21, N22, and N23 are N-channel MOS (NMOS) transistors. According to the actual design, the transistors P21, N21, N22, and N23 may be laterally diffused MOS (LDMOS) transistors. The transistor P21 may be a non-fully isolated high-voltage MOS transistor. The transistors N21, N22, and N23 may be fully isolated high-voltage MOS transistors or fully isolated laterally diffused MOS (fully isolated LDMOS) transistors.

The first terminal (e.g., the source) of the pull-up transistor P21 is coupled to the power voltage VGH2, wherein the power voltage VGH2 is higher than the substrate voltage of the die (VSUB, generally 0 V). The level of the power voltage VGH2 may be determined according to the actual design. For example (but not limited thereto), the level of the power voltage VGH2 may be 40 V or other fixed level higher than the substrate voltage. The second terminal (e.g., the drain) of the pull-up transistor P21 is coupled to the output terminal LVSH_OUT2 of the level shifter 200. The first terminal (e.g., the source) of the pull-down transistor N21 is coupled to the power voltage VGL2, wherein the power voltage VGL2 is lower than the substrate voltage of the die. The level of the power voltage VGL2 may be determined according to the actual design. For example (but not limited thereto), the level of the power voltage VGL2 may be −20 V or other fixed level lower than the substrate voltage.

The first terminal (e.g., the source) of the pull-down transistor N22 is coupled to the second terminal (e.g., the drain) of the pull-down transistor N21. The voltages of the first terminal of the pull-down transistor N22 and the second terminal of the pull-down transistor N21 are the node voltage VBOOT. The second terminal (e.g., the drain) of the pull-down transistor N22 is coupled to the output terminal LVSH_OUT2 of the level shifter 200. The first terminal (e.g., the source) of the charge sharing transistor N23 is coupled to the first terminal of the pull-down transistor N22 and the second terminal of the pull-down transistor N21. The second terminal (e.g., the drain) of the charge sharing transistor N23 is coupled to a charge sharing voltage VCS2. The level of the charge sharing voltage VCS2 is between the power voltage VGH2 and the power voltage VGL2. The level of the charge sharing voltage VCS2 may be determined according to the actual design. For example (but not limited thereto), the level of the charge sharing voltage VCS2 may be 0 V or other fixed levels.

Figure 3:
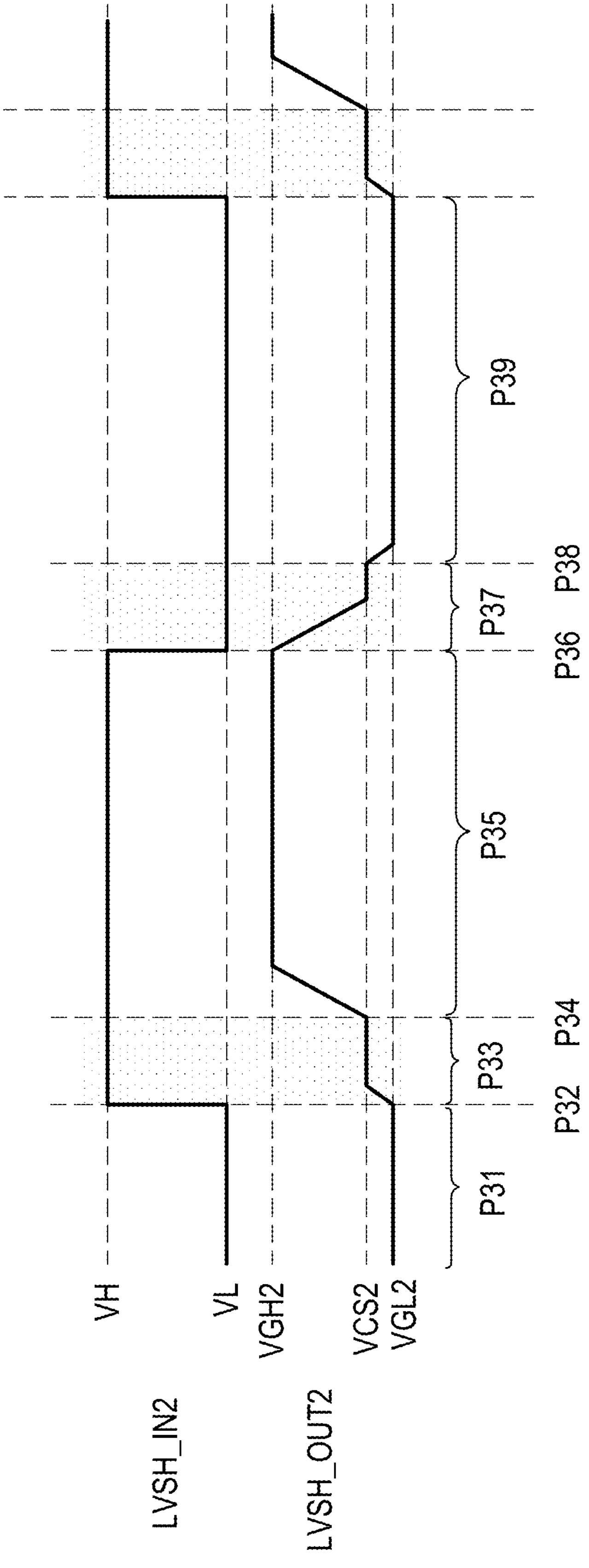
FIG. 3 is a schematic waveform diagram of an input terminal and an output terminal of a level shifter shown according to an embodiment of the invention.
Figure 4:
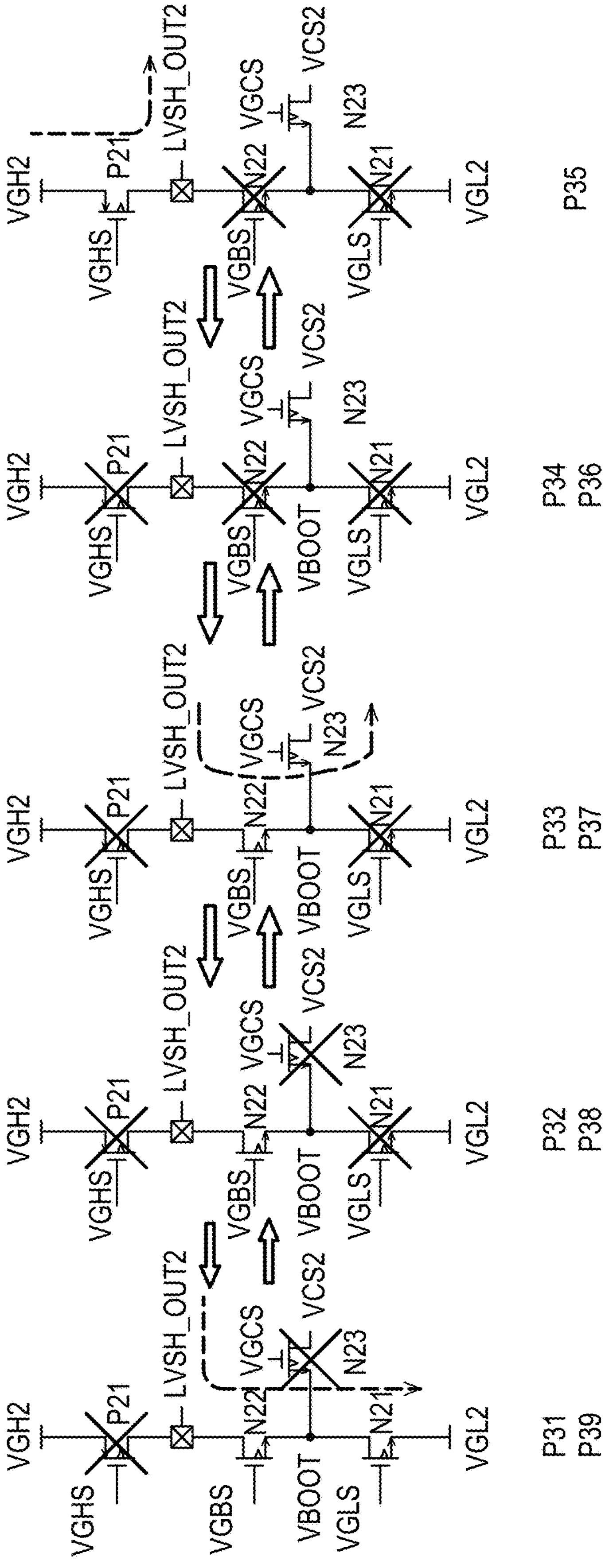
FIG. 4 is a schematic diagram of the operation of a transistor shown according to an embodiment of the invention.

FIG. 3 is a schematic waveform diagram of an input terminal LVSH_IN2 and an output terminal LVSH_OUT2 of the level shifter 200 shown according to an embodiment of the invention. The horizontal axis of FIG. 3 represents time. FIG. 4 is a schematic diagram of the operation of the transistors P21, N21, N22, and N23 shown according to an embodiment of the invention. Please refer to FIG. 2, FIG. 3, and FIG. 4. In a transition stage P31, the input terminal LVSH_IN2 is an original low level VL (for example, 0 V). Therefore, the control circuit 210 turns off the pull-up transistor P21 and the charge sharing transistor N23, and turns on the pull-down transistor N21 and the pull-down transistor N22. At this time, the output voltage of the output terminal LVSH_OUT2 is pulled down to the level of the power voltage VGL2 (for example, −20 V), and the node voltage VBOOT is also pulled down to the level of the power voltage VGL2. In the transition stage P31, the cross-voltage of the charge sharing transistor N23 is VCS2−VGL2, for example, 0−(−20)=20 V.

In response to the input voltage of the input terminal LVSH_IN2 transitioning from the original low level VL to an original high level VH (for example, 5 V), in a transition stage P32, the control circuit 210 turns on the pull-down transistor N22 and turns off the pull-up transistor P21, the pull-down transistor N21, and the charge sharing transistor N23. At this time, the output voltage of the output terminal LVSH_OUT2 and the node voltage VBOOT are maintained at the level of the power voltage VGL2. The control circuit 210 turns on the pull-down transistor N22 and the charge sharing transistor N23 and turns off the pull-up transistor P21 and the pull-down transistor N21 in a transition stage P33 after the transition stage P32. At this time, the output voltage of the output terminal LVSH_OUT2 is pulled to the level of the charge sharing voltage VCS2 (for example, 0 V), and the node voltage VBOOT is also pulled down to the level of the charge sharing voltage VCS2. In the transition stage P33, the cross-voltage of the pull-down transistor N21 is VCS2−VGL2, for example, 0−(−20)=20 V. The control circuit 210 turns on the charge sharing transistor N23 and turns off the pull-up transistor P21, the pull-down transistor N21, and the pull-down transistor N22 in a transition stage P34 after the transition stage P33. At this time, the output voltage of the output terminal LVSH_OUT2 and the node voltage VBOOT are maintained at the level of the charge sharing voltage VCS2. The control circuit 210 turns on the pull-up transistor P21 and the charge sharing transistor N23 and turns off the pull-down transistor N21 and the pull-down transistor N22 in a transition stage P35 after the transition stage P34. At this time, the output voltage of the output terminal LVSH_OUT2 is pulled up to the level of the power voltage VGH2 (for example, 40 V), and the node voltage VBOOT is maintained at the level of the charge sharing voltage VCS2. In the transition stage P35, the cross-voltage of the pull-down transistor N21 is VCS2−VGL2, for example, 0−(−20)=20 V, and the cross-voltage of the pull-down transistor N22 is VGH2−VCS2, for example, 40−0=40 V.

In response to the input voltage of the input terminal LVSH_IN2 transitioning from the original high level VH to the original low level VL, the control circuit 210 turns on the charge sharing transistor N23 and turns off the pull-up transistor P21, the pull-down transistor N21, and the pull-down transistor N22 in a transition stage P36 after the transition stage P35. At this time, the output voltage of the output terminal LVSH_OUT2 is maintained at the level of the power voltage VGH2 (for example, 40 V), and the node voltage VBOOT is maintained at the level of the charge sharing voltage VCS2. In the transition stage P36, the cross-voltage of the pull-down transistor N21 is VCS2−VGL2, for example, 0−(−20)=20 V, and the cross-voltage of the pull-down transistor N22 is VGH2−VCS2, for example, 40−0=40 V. The control circuit 210 turns on the pull-down transistor N22 and the charge sharing transistor N23 and turns off the pull-up transistor P21 and the pull-down transistor N21 in a transition stage P37 after the transition stage P36. At this time, the output voltage of the output terminal LVSH_OUT2 is pulled to the level of the charge sharing voltage VCS2 (for example, 0 V), and the node voltage VBOOT is maintained at the level of the charge sharing voltage VCS2. In the transition stage P37, the cross-voltage of the pull-down transistor N21 is VCS2−VGL2, for example, 0−(−20)=20 V. The control circuit 210 turns on the pull-down transistor N22 and turns off the pull-up transistor P21, the pull-down transistor N21, and the charge sharing transistor N23 in a transition stage P38 after the transition stage P37. At this time, the output voltage of the output terminal LVSH_OUT2 and the node voltage VBOOT are maintained at the level of the power voltage VGL2. The control circuit 210 turns on the pull-down transistor N21 and the pull-down transistor N22 and turns off the pull-up transistor P21 and the charge sharing transistor N23 in a transition stage P39 after the transition stage P38. At this time, the output voltage of the output terminal LVSH_OUT2 and the node voltage VBOOT are pulled down to the level of the power voltage VGL2 (for example, −20 V). In the transition stage P39, the cross-voltage of the charge sharing transistor N23 is VCS2−VGL2, for example, 0−(−20)=20 V.

From the relevant description of FIG. 4, it may be known that the maximum cross-voltage of the pull-down transistor N21 is VCS2−VGL2, for example, 0−(−20)=20 V. The maximum cross-voltage of the pull-down transistor N22 is VGH2−VCS2, for example, 40−0=40 V. The maximum cross-voltage of the charge sharing transistor N23 is VCS2−VGL2, for example, 0−(−20)=20 V. That is, assuming that the transistors N21, N22, and N23 are fully isolated laterally diffused MOS (fully isolated LDMOS) transistors, and the cross-voltage withstand capability (rated maximum source-drain voltage) of a fully isolated LDMOS transistor is approximately 40 V, the maximum cross-voltage of the transistors N21, N22, and N23 does not exceed the cross-voltage withstand capability of the fully isolated LDMOS transistor. Therefore, the voltage difference between the power voltage VGH2 and the power voltage VGL2 (for example, 40−(−20)=60 V) may be greater than the cross-voltage withstand capability of any of the pull-down transistor N21, the pull-down transistor N22, and the charge sharing transistor N23.

Figure 5:
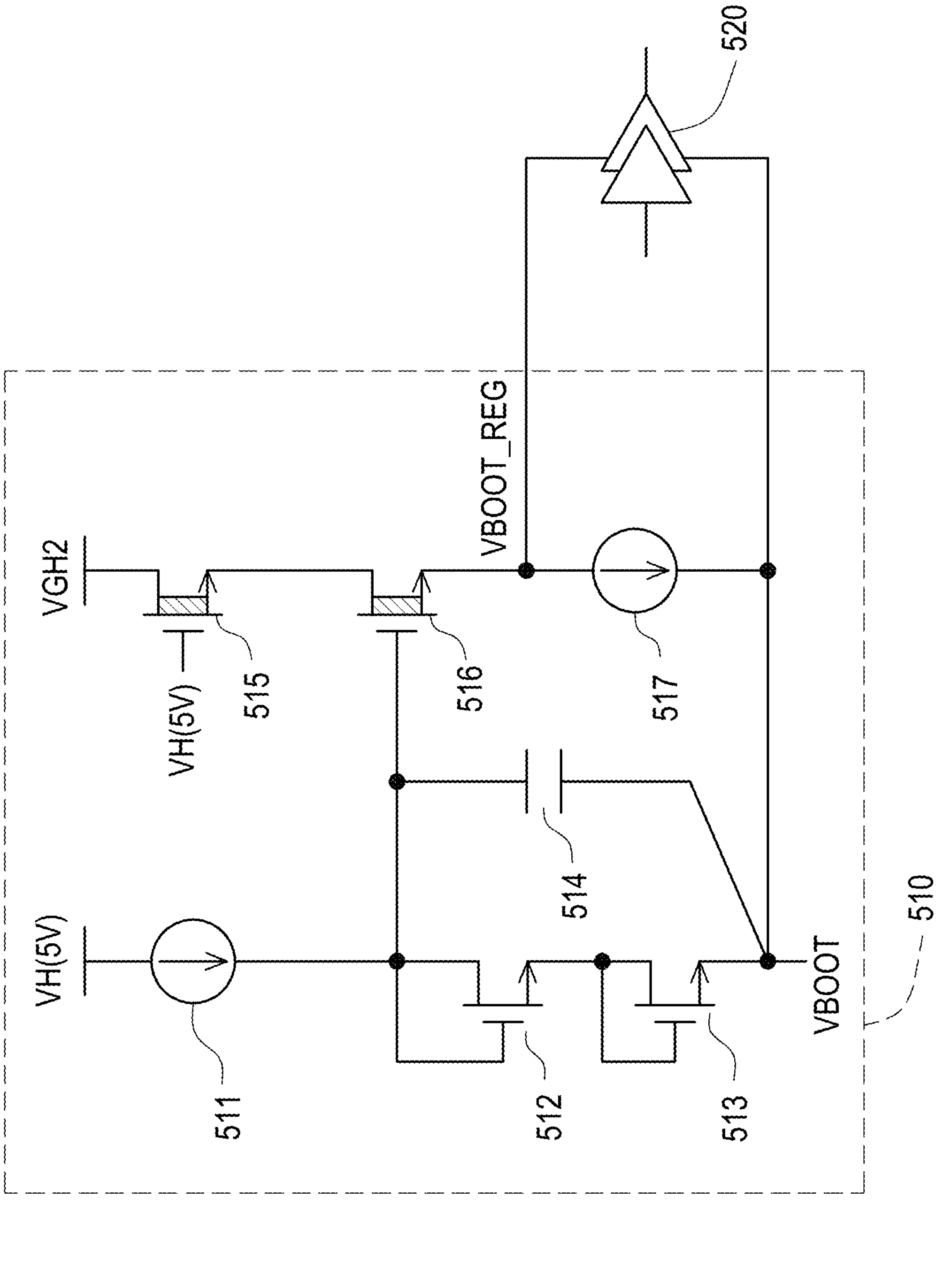
FIG. 5 is a partial circuit schematic diagram of a control circuit shown according to an embodiment of the invention.

FIG. 5 is a partial circuit schematic diagram of the control circuit 210 shown according to an embodiment of the invention. Referring to FIG. 2 and FIG. 5, the control circuit 210 further includes a node voltage generating circuit 510 shown in FIG. 5. The node voltage generating circuit 510 is coupled to the first terminal of the pull-down transistor N22 and the second terminal of the pull-down transistor N21 to receive the node voltage VBOOT. The node voltage generating circuit 510 may generate the node voltage VBOOT_REG based on the node voltage VBOOT. The power terminal of a driver 520 (such as the driver 213 or 215 shown in FIG. 2) is coupled to the node voltage generating circuit 200 to receive the node voltage VBOOT_REG. The reference terminal of the driver 520 is coupled to the first terminal of the pull-down transistor N22 and the second terminal of the pull-down transistor N21 to receive the node voltage VBOOT.

In the embodiment shown in FIG. 5, the node voltage generating circuit 510 includes a current source 511, a transistor 512, a transistor 513, a capacitor 514, a transistor 515, a transistor 516, and a current source 517. The first terminal of the current source 511 is coupled to a difference voltage, such as the original high level VH (e.g., 5 V). The first terminal (e.g., the drain) and the control terminal (e.g., the gate) of the transistor 512 are coupled to the second terminal of the current source 511. The first terminal (e.g., the drain) and the control terminal (e.g., the gate) of the transistor 513 are coupled to the second terminal (e.g., the source) of the transistor 512. The second terminal (e.g., the source) of the transistor 513 is coupled to the first terminal of the pull-down transistor N22 and the second terminal of the pull-down transistor N21 to receive the node voltage VBOOT. The first terminal of the capacitor 514 is coupled to the first terminal of the transistor 512. The second terminal of the capacitor 514 is coupled to the second terminal of the transistor 513.

The first terminal (e.g., the drain) of the transistor 515 is coupled to the power voltage VGH2 (e.g., 40 V). The control terminal (e.g., the gate) of the transistor 515 is coupled to a difference voltage, such as the original high level VH (e.g., 5 V). The first terminal (e.g., the drain) of the transistor 516 is coupled to the second terminal (e.g., the source) of the transistor 515. The control terminal (e.g., gate) of the transistor 516 is coupled to the first terminal of the transistor 512. The second terminal (e.g., the source) of the transistor 516 is coupled to the power terminal of the driver 520 to provide the node voltage VBOOT_REG. The transistors 515 and 516 may be laterally diffused MOS (LDMOS) transistors. The first terminal of the current source 517 is coupled to the second terminal of the transistor 516. The second terminal of the current source 517 is coupled to the first terminal of the pull-down transistor N22 and the second terminal of the pull-down transistor N21 to receive the node voltage VBOOT.

Based on the above, the pull-down transistors N21 and N22 may be fully isolated MOS transistors. Therefore, the pull-down transistors N21 and N22 do not cause leakage to the substrate of the die. Since leakage does not occur to fully isolated MOS transistors, the substrate voltage of the die may be set to 0 V. Accordingly, the adhesive layer between the substrate of the die and the base plate of the package may be made of a conductive material (since the voltage of the package base plate is generally 0 V). It is conceivable that if the adhesive layer between the substrate of the die and the base plate of the package is made of a conductive material, the heat energy of the die may be readily guided to the outside of the package via the adhesive layer and the package base plate. In addition, the pull-down transistors N21 and N22 are connected in series between the output terminal LVSH_OUT2 of the level shifter 200 and the power voltage VGL2, wherein the power voltage VGL2 is lower than the substrate voltage of the die (generally 0 V). Therefore, the cross-voltage withstand capability (rated maximum source-drain voltage) of any in the pull-down transistors N21 and N22 may be less than the voltage difference between the power voltage VGH2 and the power voltage VGL2.

Figure 6:
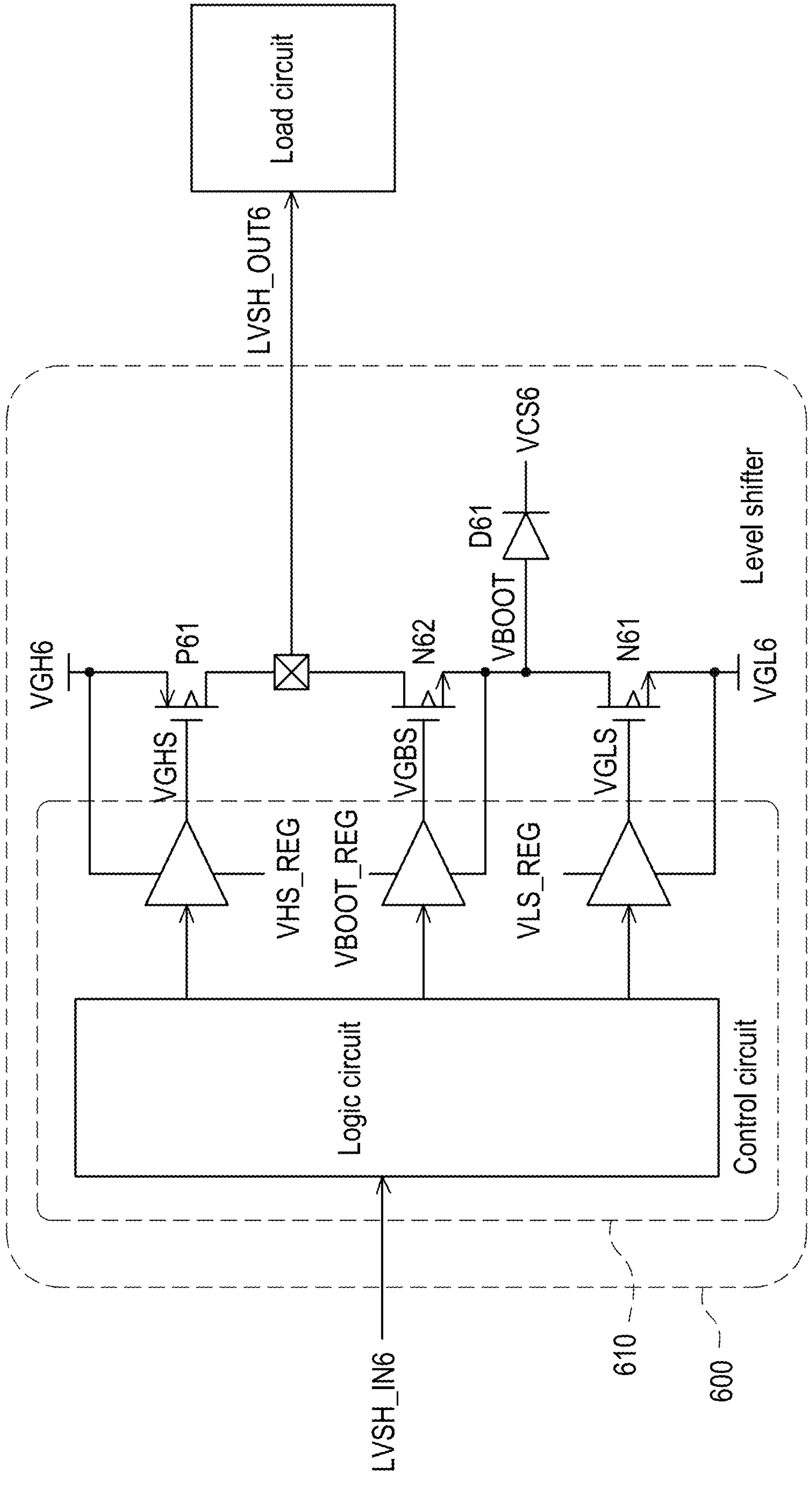
FIG. 6 is a schematic circuit block diagram of a level shifter according to another embodiment of the invention.

FIG. 6 is a schematic circuit block diagram of a level shifter 600 according to another embodiment of the invention. The level shifter 600 is disposed in a die. The level shifter 600, an input terminal LVSH_IN6, an output terminal LVSH_OUT6, a load circuit, a control circuit 610, a power voltage VGH6, a pull-up transistor P61, a pull-down transistor N61, a pull-down transistor N62, and a power voltage VGL6 shown in FIG. 6 are as provided in the relevant descriptions of the level shifter 200, the input terminal LVSH_IN2, the output terminal LVSH_OUT2, the load circuit, the control circuit 210, the power voltage VGH2, the pull-up transistor P21, the pull-down transistor N21, the pull-down transistor N22, and the power voltage VGL2 shown in FIG. 2 and analogized as such, and are therefore not repeated herein.

What is different from the level shifter 200 shown in FIG. 2 is that the level shifter 600 shown in FIG. 6 includes a charge sharing diode D61. The first terminal (e.g., the anode) of the charge sharing diode D61 is coupled to the first terminal of the pull-down transistor N62 and the second terminal of the pull-down transistor N61 to receive the node voltage VBOOT. The second terminal (for example, the cathode) of the charge sharing diode D61 is coupled to the charge sharing voltage VCS6. The level of the charge sharing voltage VCS6 is between the power voltage VGH6 and the power voltage VGL6. The level of the charge sharing voltage VCS6 may be determined according to the actual design. For example (but not limited thereto), the level of the charge sharing voltage VCS6 may be 0 V or other fixed levels.

Figure 7:
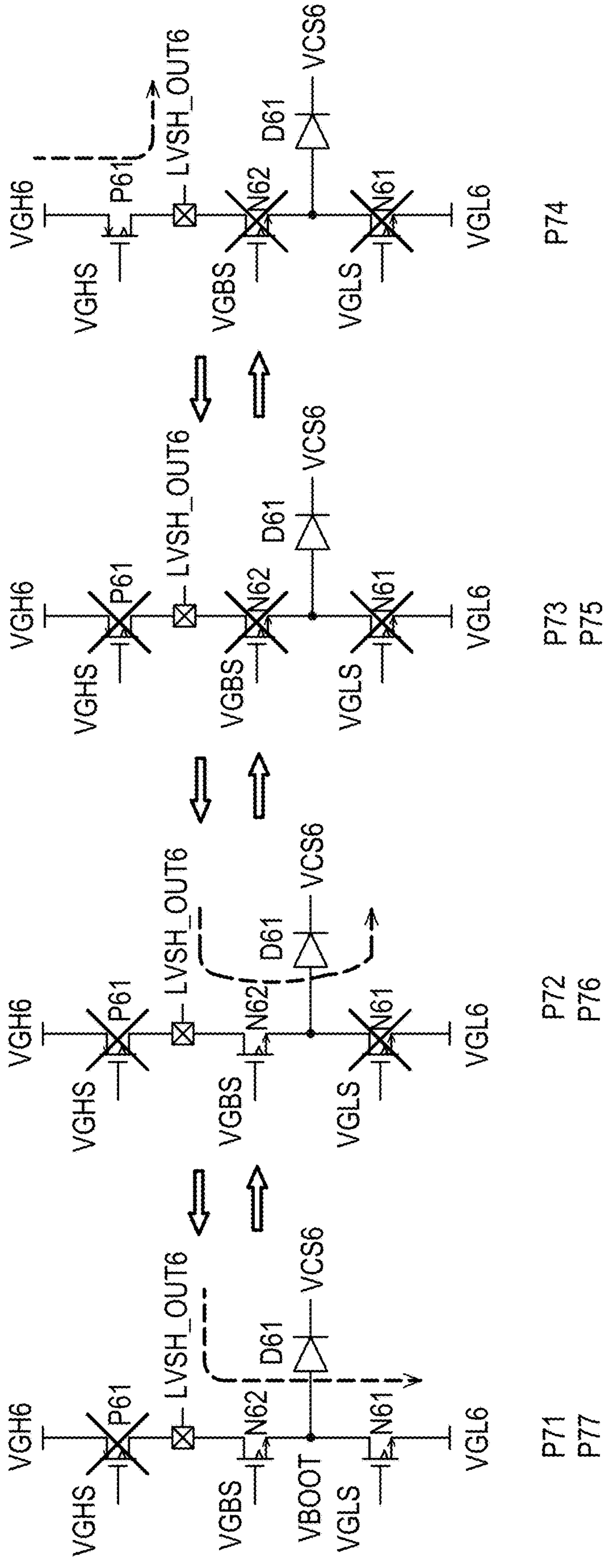
FIG. 7 is a schematic diagram of the operation of a transistor shown according to another embodiment of the invention.

FIG. 7 is a schematic diagram of the operation of the transistors P61, N61, and N62 shown according to another embodiment of the invention. Please refer to FIG. 6 and FIG. 7. In a transition stage P71, the input terminal LVSH_IN6 is the original low level VL (for example, 0 V). Therefore, the control circuit 610 turns off the pull-up transistor P61 and turns on the pull-down transistors N61 and N62. At this time, the output voltage of the output terminal LVSH_OUT6 is pulled down to the level of the power voltage VGL6 (for example, −20 V), and the node voltage VBOOT is also pulled down to the level of the power voltage VGL6.

In response to the input voltage of the input terminal LVSH_IN6 of the level shifter 600 transitioning from the original low level VL to the original high level VH (for example, 5 V), the control circuit 610 turns on the pull-down transistor N62 and turns off the pull-up transistor P61 and the pull-down transistor N61 in a transition stage P72. The control circuit 610 turns off the pull-up transistor P61, the pull-down transistor N62, and the pull-down transistor N61 in a transition stage P73 after the transition stage P72. The control circuit 610 turns on the pull-up transistor P61 and turns off the pull-down transistor N61 and the pull-down transistor N62 in a transition stage P74 after the transition stage P73. At this time, the output voltage of the output terminal LVSH_OUT6 is pulled up to the level of the power voltage VGH6 (for example, 40 V).

In response to the input voltage of the input terminal LVSH_IN6 of the level shifter 600 transitioning from the original high level VH to the original low level VL, the control circuit 610 turns off the pull-up transistor P61, the pull-down transistor N62, and the pull-down transistor N61 in a transition stage P75 after the transition stage P74. The control circuit 610 turns on the pull-down transistor N62 and the charge-sharing diode D61 and turns off the pull-up transistor P61 and the pull-down transistor N61 in a transition stage P76 after the transition stage P75. At this time, the output voltage of the output terminal LVSH_OUT6 and the node voltage VBOOT are pulled to the level of the charge sharing voltage VCS6. The control circuit 610 turns on the pull-down transistor N61 and the pull-down transistor N62 and turns off the pull-up transistor P61 in a transition stage P77 after the transition stage P76. At this time, the output voltage of the output terminal LVSH_OUT6 and the node voltage VBOOT are pulled to the level of the power voltage VGL6.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A level shifter, disposed at a die, the level shifter comprising:

a pull-up transistor having a first terminal, a second terminal, and a control terminal, wherein the first terminal of the pull-up transistor is coupled to a first power voltage, the first power voltage is higher than a substrate voltage of the die, and the second terminal of the pull-up transistor is coupled to an output terminal of the level shifter;

a first pull-down transistor having a first terminal, a second terminal, and a control terminal, wherein the first terminal of the first pull-down transistor is coupled to a second power voltage, and the second power voltage is lower than the substrate voltage of the die;

a second pull-down transistor having a first terminal, a second terminal, and a control terminal, wherein the first terminal of the second pull-down transistor is coupled to the second terminal of the first pull-down transistor, and the second terminal of the second pull-down transistor is coupled to the output terminal of the level shifter; and a control circuit having an input terminal, a first output terminal, a second output terminal, and a third output terminal, wherein the input terminal of the control circuit is coupled to an input terminal of the level shifter, the first output terminal of the control circuit is coupled to the control terminal of the pull-up transistor, the second output terminal of the control circuit is coupled to the control terminal of the second pull-down transistor, and the third output terminal of the control circuit is coupled to the control terminal of the first pull-down transistor.

2. The level shifter of claim 1, wherein the first pull-down transistor and the second pull-down transistor are fully isolated high-voltage metal-oxide-semiconductor transistors.

3. The level shifter of claim 2, wherein the first pull-down transistor and the second pull-down transistor are fully isolated laterally diffused metal-oxide-semiconductor transistors.

4. The level shifter of claim 1, wherein a voltage difference between the first power voltage and the second power voltage is greater than a cross-voltage withstand capability in any of the first pull-down transistor and the second pull-down transistor.

5. The level shifter of claim 1, further comprising:

a charge sharing transistor having a first terminal, a second terminal, and a control terminal, wherein the first terminal of the charge sharing transistor is coupled to the first terminal of the second pull-down transistor and the second terminal of the first pull-down transistor, the second terminal of the charge sharing transistor is coupled to a charge sharing voltage, and the control terminal of the charge sharing transistor is coupled to a fourth output terminal of the control circuit.

6. The level shifter of claim 5, wherein a level of the charge sharing voltage is between the first power voltage and the second power voltage.

7. The level shifter of claim 5, wherein, in response to an input voltage of the input terminal of the level shifter transitioning from an original low level to an original high level, the control circuit turns on the second pull-down transistor and turns off the pull-up transistor, the first pull-down transistor, and the charge sharing transistor in a first transition stage, the control circuit turns on the second pull-down transistor and the charge sharing transistor and turns off the pull-up transistor and the first pull-down transistor in a second transition stage after the first transition stage, the control circuit turns on the charge sharing transistor and turns off the pull-up transistor, the first pull-down transistor, and the second pull-down transistor in a third transition stage after the second transition stage, and the control circuit turns on the pull-up transistor and the charge sharing transistor and turns off the first pull-down transistor and the second pull-down transistor in a fourth transition stage after the third transition stage; and in response to an input voltage of the input terminal of the level shifter transitioning from the original high level to the original low level, the control circuit turns on the charge sharing transistor and turns off the pull-up transistor, the first pull-down transistor, and the second pull-down transistor in a fifth transition stage, the control circuit turns on the second pull-down transistor and the charge sharing transistor and turns off the pull-up transistor and the first pull-down transistor in a sixth transition stage after the fifth transition stage, the control circuit turns on the second pull-down transistor and turns off the pull-up transistor, the first pull-down transistor, and the charge sharing transistor in a seventh transition stage after the sixth transition stage, and the control circuit turns on the first pull-down transistor and the second pull-down transistor and turns off the pull-up transistor and the charge sharing transistor in an eighth transition stage after the seventh transition stage.

8. The level shifter of claim 1, wherein the first output terminal of the control circuit outputs a first control signal to control the control terminal of the pull-up transistor, the second output terminal of the control circuit outputs a second control signal to control the control terminal of the second pull-down transistor, the third output terminal of the control circuit outputs a third control signal to control the control terminal of the first pull-down transistor, a voltage between the first terminal of the second pull-down transistor and the second terminal of the first pull-down transistor is a first node voltage, a second node voltage is the first node voltage plus a difference voltage, and a swing of the second control signal is between the first node voltage and the second node voltage.

9. The level shifter of claim 8, wherein the control circuit comprises:

a node voltage generating circuit coupled to the first terminal of the second pull-down transistor and the second terminal of the first pull-down transistor to receive the first node voltage, wherein the node voltage generating circuit generates the second node voltage based on the first node voltage; and a driver having a power terminal, a reference terminal, and an output terminal, wherein the power terminal of the driver is coupled to the node voltage generating circuit to receive the second node voltage, the reference terminal of the driver is coupled to the first terminal of the second pull-down transistor and the second terminal of the first pull-down transistor to receive the first node voltage, and the output terminal of the driver is coupled to the control terminal of the second pull-down transistor to provide the second control signal.

10. The level shifter of claim 9, wherein the node voltage generating circuit comprises:

a first current source having a first terminal and a second terminal, wherein the first terminal of the first current source is coupled to the difference voltage;

a first transistor having a first terminal, a second terminal, and a control terminal, wherein the first terminal and the control terminal of the first transistor are coupled to the second terminal of the first current source; and a second transistor having a first terminal, a second terminal, and a control terminal, wherein the first terminal and the control terminal of the second transistor are coupled to the second terminal of the first transistor, and the second terminal of the second transistor is coupled to the first terminal of the second pull-down transistor and the second terminal of the first pull-down transistor to receive the first node voltage;

a third transistor having a first terminal, a second terminal, and a control terminal, wherein the first terminal of the third transistor is coupled to the first power voltage, and the control terminal of the third transistor is coupled to the difference voltage;

a fourth transistor having a first terminal, a second terminal, and a control terminal, wherein the first terminal of the fourth transistor is coupled to the second terminal of the third transistor, the control terminal of the fourth transistor is coupled to the first terminal of the first transistor, and the second terminal of the fourth transistor is coupled to the power terminal of the driver; and a second current source having a first terminal and a second terminal, wherein the first terminal of the second current source is coupled to the second terminal of the fourth transistor, and the second terminal of the second current source is coupled to the first terminal of the second pull-down transistor and the second terminal of the first pull-down transistor to receive the first node voltage.

11. The level shifter of claim 8, wherein a third power voltage is the first power node voltage minus a difference voltage, and a swing of the first control signal is between the first power voltage and the third power voltage.

12. The level shifter of claim 8, wherein a fourth power voltage is the second power node voltage plus a difference voltage, and a swing of the third control signal is between the fourth power voltage and the second power voltage.

13. The level shifter of claim 1, further comprising:

a charge sharing diode having a first terminal and a second terminal, wherein the first terminal of the charge sharing diode is coupled to the first terminal of the second pull-down transistor and the second terminal of the first pull-down transistor, and the second terminal of the charge sharing diode is coupled to a charge sharing voltage.

14. The level shifter of claim 13, wherein a level of the charge sharing voltage is between the first power voltage and the second power voltage.

15. The level shifter of claim 13, wherein, in response to an input voltage of the input terminal of the level shifter transitioning from an original low level to an original high level, the control circuit turns on the second pull-down transistor and turns off the pull-up transistor and the first pull-down transistor in a first transition stage, the control circuit turns off the pull-up transistor, the second pull-down transistor, and the first pull-down transistor in a second transition stage after the first transition stage, and the control circuit turns on the pull-up transistor and turns off the first pull-down transistor and the second pull-down transistor in a third transition stage after the second transition stage; and in response to an input voltage of the input terminal of the level shifter transitioning from the original high level to the original low level, the control circuit turns off the pull-up transistor, the second pull-down transistor, and the first pull-down transistor in a fourth transition stage, the control circuit turns on the second pull-down transistor and the charge sharing diode and turns off the pull-up transistor and the first pull-down transistor in a fifth transition stage after the fourth transition stage, and the control circuit turns on the first pull-down transistor and the second pull-down transistor and turns off the pull-up transistor in a sixth transition stage after the fifth transition stage.

* * * * *